METHOD OF FORMING SEMICONDUCTIVE BODIES

Filed March 5, 1954

2 Sheets-Sheet 1

INVENTOR
C. S. FULLER
BY John C. Morris
ATTORNEY

INVENTOR
C. S. FULLER
BY John C. Morris
ATTORNEY

United States Patent Office 3,015,590
Patented Jan. 2, 1962

3,015,590

METHOD OF FORMING SEMICONDUCTIVE BODIES

Calvin S. Fuller, Chatham, N.J., assignor to Bell Telephone Laboratories, Incorporated, New York, N.Y., a corporation of New York Filed Mar. 5, 1954, Ser. No. 414,272
5 Claims. (Cl. 148—1.5)

Figure 1:
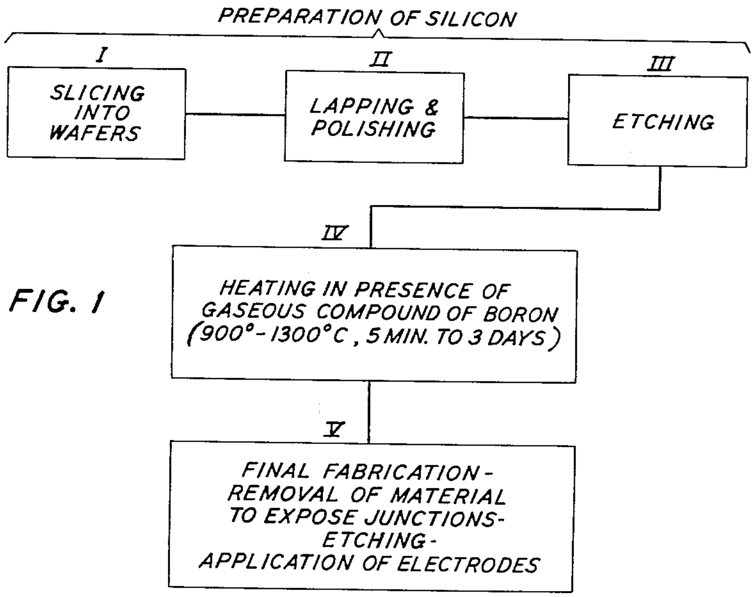

This invention relates to the fabrication of semiconductor devices and more particularly to a method of producing p-n junctions in semiconductive material.

Semiconductive material, as is known, may be of either of two distinct or opposite conductivity types designated p and n, the p material exhibiting low resistance to current flow to a metallic connection thereto when it is positive relative to the connection and the n material exhibiting such low resistance when it is negative with respect to the connection. As is also known, the conductivity type may be determined by the relative amounts of acceptor and donor atoms in the material, p-type conductivity being associated with an excess of acceptors and n-type conductivity being associated with an excess of donors.

The use of certain elements as significant impurities to alter the conductivity and conductivity type of semiconductive materials as well as the technique of introducing such impurities by diffusion into the solid material is known in the art. Generally, the method of introducing a significant impurity in a semiconductor body by applying heat while the body is in contact with the impurity in one or the other of the gaseous, liquid or solid forms offers manifest advantages over other methods of producing p-n junctions. Prominent among such advantages are facility and economy of manufacture. Representative diffusion processes enjoying such advantages are disclosed in U.S. Patents 2,725,315 and 2,725,316 granted to me on November 29, 1955.

However, it has been found that the techniques hitherto employed do not enable one to provide structures that may be used advantageously in the fabrication of certain novel devices. Generally, these devices relate to junction-type semi-conductors which are highly useful in the areas of protecting signaling apparatus from current surges, conversion of solar to electrical energy, power rectification, and photoresistance elements. Further reference will be made subsequently to specific exemplary structures.

One object of this invention is to produce new and useful junction-type devices such as those set forth hereinabove.

Another object is to enable facile and precise fabrication of large area, thin layer, junction-type devices.

Generally, in the devices of the types referred to above the unique and desirable performance is a consequence of large area junctions produced by a relatively thin surface penetration. For example, in a silicon junction-type device for the conversion of solar to electrical energy the diffused layer may be of the order of one-tenth mil in thickness. Optimum performance in a device of this type additionally requires a barrier layer which conforms closely to the surface configuration. Diffusion techniques previously employed involve materials having relatively high rates of diffusion with a consequent departure from the desired conformity, especially for thin layers.

This invention involves the discovery that by heating a compound of boron in the vapor state in the presence of silicon, boron is diffused into the solid at an exceedingly low rate which enables a high degree of controllability of the depth of penetration. It has been found also that junctions produced by the method of this invention are permanent, exhibiting no tendency to change with time.

It is, therefore, a feature of this invention that the depth of penetration of the diffused layer in the semiconductive body may be controlled to extreme nicety, for example, to about one-tenth mil and less.

Another feature resides in marked conformity of the junction to the surface configuraiton enabled by the method of this invention. Thus, this invention enables the production of junction devices having unique geometrical structure such as cavity photocells and low reflectivity solar energy converters.

A further feature of this invention pertains to the low resistivity of the surface layer produced thereby enabling facile connection of electrodes thereto.

In accordance with one broad aspect of this invention a p-n junction is produced by placing a body of n-conductivity type silicon in a container with a small quantity of a boron compound in the gaseous state, and subjecting the assembly to a temperature between 900° C. and 1300° C. for a period of from several minutes to many hours, depending upon the depth of penetration desired.

Thus, it is a further feature of this invention that the boron compound vapor may be applied to the silicon material at a highly controllable rate which enables the avoidance of a deleterious boron coating on the semiconductor surface.

Figure 5:
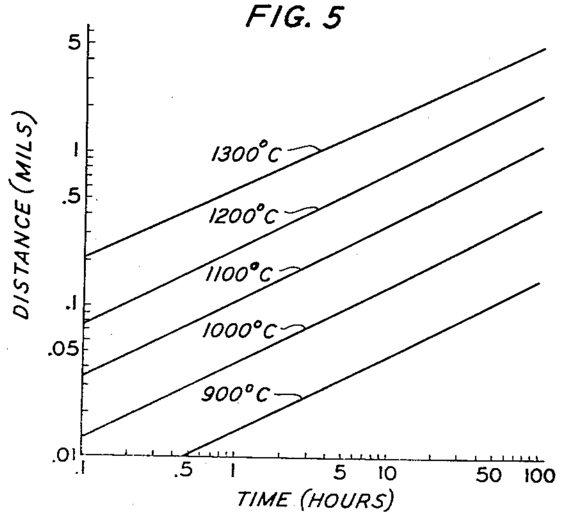
Figures 6A, 6B:
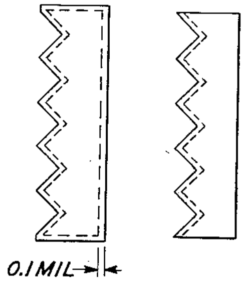

These and other objects and features will be understood more clearly and fully from the following detailed description with reference to the accompanying drawing in which:

FIG. 1 is a diagram of a form of the process in accordance with the invention;

FIGS. 2A, 2B, 2C, and 3 are diagrams illustrating schematically apparatus which may be employed in the practise of this invention;

FIGS. 4A, 4B, 4C, and 4D are enlarged sectional views of a body of silicon in each of several steps in the fabrication of signal translating devices;

FIG. 5 is a graph indicating the times and temperatures required for various depths of boron penetration; and FIGS. 6A and 6B are enlarged sectional views of the steps in the fabrication of a photosensitive device.

Referring now to the drawing, FIG. 1 sets forth three initial preparatory steps to be carried out on the silicon material. These operations comprise cutting to desired dimensions, lapping or polishing, and etching.

Single crystal n-type silicon may be sliced into convenient wafer or disc form by cutting methods known to the art. Lapping and polishing of the wafers is conveniently performed using silicon carbide abrasives in water to produce a fine matte surface free of coarse scratches. Chemical etching, for example, using concentrated nitric and hydrofluoric acids is accomplished immediately prior to the diffusion treatment in order to remove surface defects and minimize the formation of deleterious oxides on the surfaces of the semiconductive bodies.

Figure 2A:
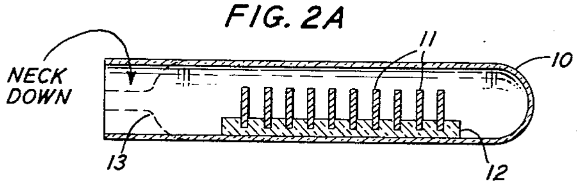
Figure 2B:
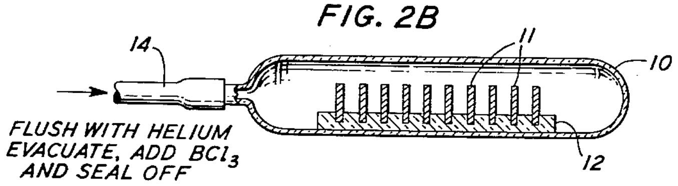
Figure 2C:
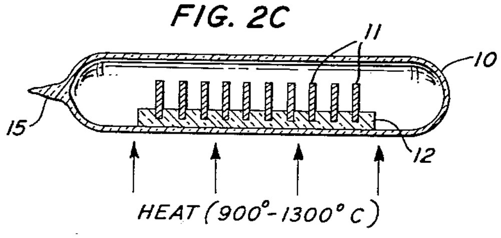

In one advantageous technique illustrated in FIGS. 2A, 2B, and 2C a ceramic tube 10 open at one end is used as a container. The silicon wafers 11 prepared as outlined in steps I, II, and III of FIG. 1 are placed in a ceramic holder 12 and inserted in the tube 10 which is then necked down as indicated by the dotted outline 13 of FIG. 2A.

Following this operation the tube 10 of FIG. 2B is flushed through connection 14 with an inert gas, for example helium, evacuated, and then filled with boron trichloride vapor at a pressure of from one to thirty centimeters of mercury at room temperature. The boron trichloride is a chemically pure grade of gas available commercially.

As indicated in FIG. 2C the neck 15 is then sealed off under this pressure. The sealed tube 10 is then placed in a tubular type furnace and heated at a relatively constant temperature in the range from 900° C. to 1300° C.

The time of heating at a given temperature is dependent upon the depth of penetration desired. Thus, if $x$ represents the depth of penetration in centimeters, D the diffusion constant for boron at a given temperature, and $k$ a constant dependent upon the resistivity of the silicon then the time in seconds may be expressed:

$$t=\frac{x^2}{kD}$$

The curves of FIG. 5 depict this relationship graphically for various temperatures as indicated. It is to be noted generally, that a higher degree of control of the diffusion depth may be attained by judicious choice of temperature, and that the lower temperature ranges requiring longer heating times for a given depth of penetration enable nicer control.

Figures 4A, 4B, 4C, 4D:
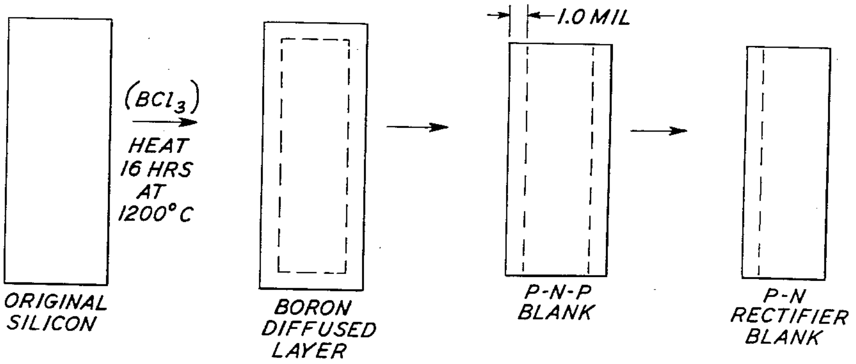

After heating, the ceramic tube is taken from the furnace, broken, and the silicon wafers separated for final fabrication. As indicated by the block V of FIG. 1 this procedure may involve removal of certain material and the attachment of electrodes. For example, in accordance with the steps depicted in FIGS. 4A, 4B, 4C, and 4D, the silicon wafer is treated to produce the junction indicated in dotted outline in FIG. 4B. By removing the end material the p-n-p structure of FIG. 4C is produced and by further removing one p-layer a p-n device results.

Alternatively, the method set forth above in connection with the apparatus of FIGS. 2A, 2B, and 2C may be accomplished by producing a vapor of a compound of boron within the sealed tube 10 by the heat employed for the diffusion. For example, after inserting the silicon wafers a small quantity of boron triiodide powder which may be loose or in a suitable ceramic dish is placed in the tube 10. The quantity of boron compound used depends on the surface area to be diffused. For example, for areas of 20 to 40 square centimeters of silicon, about 175 micrograms of boron triiodide will suffice. As before, the tube is necked down and flushed with an inert gas, following which the tube is sealed and heated. In this instance, the heat applied to promote the diffusion serves also to produce a vapor of boron iodide from which boron then diffuses into the surface of the silicon.

Figure 3:
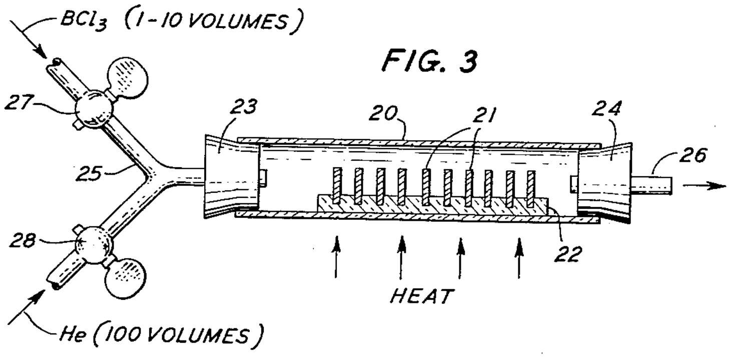

In FIG. 3 there is indicated a further advantageous technique in which the boron compound vapor, generated separately, is fed continuously over the silicon using helium as a diluent. A gas-tight ceramic tube 20 containing a ceramic boat 22 for the silicon bodies 21 is stoppered, 23 and 24, and fitted with a Y 25 at the inlet end and a straight outlet connection 26. Suitable valves 27 and 28 enable the proportioning of the boron trichloride vapor and helium gas mixture. A desirable rate of diffusion may be carried out using from one-tenth to ten volumes of boron compound vapor for every 100 volumes of helium at atmospheric pressure and temperature. The continuous flow of gas and vapor at a rate of the order of 0.05 to 1.0 liter per minute is then exhausted from the outlet connection 26, while the tube and contents are heated at a constant temperature in the range from 900° C. to 1300° C. for a specified period.

Generally, the compounds of boron belonging to the classes of halides, hydrides, and oxides may be used to generate a vapor for the diffusion treatment of silicon. For example, boron trifluoride, boron triiodide, diborane, and boron trioxide are suitable.

A specific example will indicate the method of this invention and the advantageous and unique structures attainable thereby.

Slabs of 2.0 ohm-centimeter n-type silicon 20 mils thick and one-half inch square were polished using first No. 400 silicon carbide abrasive in water followed by No. 600 silicon carbide abrasive. The lapped surfaces were then etched using a concentrated mixture of nitric and hydrofluoric acids to remove slightly in excess of one mil of material.

The slabs were placed in an upright position in a small ceramic boat and inserted in a quartz tube as depicted in FIG. 2 of the drawing. The tube was then flushed, evacuated, and filled with boron trichloride gas at a pressure of 15 centimeters of mercury. The tube was then sealed off under this pressure and heated in a tubular type furnace at 1200° C. for 16 hours.

Following this treatment a layer of p-type conductivity having a thickness of 1.0 mil was found on all surfaces of each slab. The end layers were cut from each slab and the edges were etched to produce a p-n-p structure. After the attachment of electrodes, tests showed a double saturation voltage characteristic with breaks at ±100 volts. A current of 5000 amperes was passed repeatedly at 325 volts for periods of 20 microseconds each. A device exhibiting these characteristics finds extreme usefulness in the protection of vital signaling equipment against surges of high voltage.

Another example will indicate the magnitudes of time and temperature employed in the fabrication of a device useful for conversion of solar energy to electrical energy.

Several wafers of 3.0 ohm-centimeters n-type silicon one-half by two and one-half inches and 40 mils thick were polished, etched, and subjected to the diffusion treatment in accordance with the apparatus of FIG. 3, using a continuous flow of boron trichloride vapor. The temperature was maintained at 1000° C. and the gas flow of 0.1 liter per minute proportioned to circulate about one volume of boron trichloride to 100 volumes of helium at atmosphere pressure. After five hours the wafers were removed and a p-type surface layer having a resistivity of approximately 0.01 ohm-centimeter and having a thickness of 0.1 mil was observed on each piece. After etching and attachment of electrodes a continuous current of 50 milliamperes at 0.3 volt was observed in direct sunlight.

In a further example a two-step process was employed to produce a powder rectifier of improved characteristics. A slab of n-type silicon of three ohm-centimeters resistivity and one-half inch in diameter and 40 mils thick was prepared in the usual manner and placed in a quartz tube. The container was thoroughly flushed with helium, filled with boron trichloride vapor at a pressure of 10 centimeters of mercury, and then sealed off.

After heating the assembly for 20 hours at 1250° C. all surfaces of the slab showed a diffusion layer penetration having p-type conductivity of 1.5 mils.

One p-type layer was then ground off to produce the p-n structure as shown in FIG. 4D. The slab of silicon was again placed in a quartz tube and the diffusion treatment repeated in the presence of 50 micrograms of chemically pure phosphorous and a temperature of 1100° C. for six hours. Because of the low resistivity of the p-type boron diffusion layer the phosphorous diffusion did not alter appreciably the resistivity of this zone which retains its strong p-type conductivity. However, a layer of low resistivity, termed n+ type was formed on the n-type zone surface. This n+ type layer had a thickness of 0.3 mil. After grinding off the ends of the slab and etching, a structure having successive p, n and n+ zones resulted having the following characteristics: forward saturation current 25 amperes at 2 volts and reverse current 0.2 milliampere at −40 volts.

The p-n-n+ structure thus produced has the unique property of enabling facile connection thereto. Following a light sand blast the p and n+ surfaces, both of low resistivity were metallized by plating and excellent contact was then made using copper electrodes. This device may be employed to advantage as a power rectifier.

Other devices finding use as photoresistive elements, as unipolar and bipolar transistors having unique shapes may be produced by the advantageous method of this invention. For example, FIGS. 6A and 6B illustrate two steps in the fabrication of a photosensitive p-n junction device for the conversion of solar to electrical energy. The serrated cross section represents a surface designed to minimize energy loss by direct reflection. By means of any one of the diffusion techniques hereinbefore set forth a junction is produced over the entire surface as indicated by the dotted outline. By then cropping the ends of the silicon slab and removing the plane junction from the planar side to permit back connection a photosensitive structure is achieved.

Similarly, by providing a square-toothed surface cross section on a body of n-type silicon, another novel structure is attained. A complete p-type layer is formed over the entire silicon body after which the "tooth" ends are cut off as well as the back and end surfaces of the body. The resultant structure is an n-type body having an array of cavities on one surface, each cavity having a lining comprising a thin p-type layer. This structure finds use in a photosensitive device for switching applications.

Other alternative techniques will be obvious to those skilled in the art. For example, boron halides may be heated to the point of "cracking" in the presence of silicon. A film of elemental boron will then be deposited on the silicon and diffusion may then be accomplished by further heating.

What is claimed is:

1. The method of diffusing a significant impurity into a body of n-type conductivity silicon to a depth of the order of 0.1 mil which comprises heating said body in a gas flow composed of about one volume of boron trifluoride vapor and 100 volumes of helium at a rate of about 0.5 liter per minute at a temperature of 1000° C. for a period of about five hours.

2. The method of fabricating a junction-type semiconductor signal translating device from a body of n-type conductivity silicon which comprises providing a planar junction at a depth within 0.1 mil from a surface of said body, said method comprising the steps of placing said body in an enclosure, maintaining the body for at least five minutes at a temperature between 900° C. and 1300° C. and circulating past said heated body the vapor of a boron compound mixed with an inert gas at a boron vapor pressure such that elemental boron diffuses into the solid silicon body without any discernible melting of the silicon surface or formation of a significant boron deposit on said body, thereby to convert said diffused portion to p-type conductivity silicon, removing said body from said chamber, and treating said body to remove the diffused surface portions from selected regions, thereby to produce a body having at least one surface portion of p-type conductivity and at least one surface portion of n-type conductivity.

3. The method in accordance with claim 2 in which said boron compound is one selected from the group consisting of the halides, hydrides and oxides.

4. The method in accordance with claim 3 in which said mixture has the proportions of one volume of said boron compound to about 100 volumes of the inert gas.

5. The method of producing a PN junction in an N-type silicon semiconductor electrical translating device by diffusing atoms of an acceptor impurity into an N-type conductivity silicon semiconductor crystal, said method including the steps of: placing the crystal and a quantity of boron hydride into a container, evacuating said container, sealing said container from the atmosphere, and heating said container to a value of temperature above the decomposition temperature of said hydride and below the temperature at which a molten phase forms, and below the melting point of silicon to permit some of the boron atoms to deposit upon and diffuse into said crystal in a reducing atmosphere produced by the release of hydrogen gas from said hydride.

References Cited in the file of this patent

UNITED STATES PATENTS

| | | |
|---|---|---|
| 1,774,410 | Van Arkel | Aug. 26, 1930 |
| 2,441,603 | Storks | May 18, 1948 |
| 2,528,454 | Schlesinger | Oct. 21, 1950 |
| 2,556,711 | Teal | June 12, 1951 |
| 2,560,594 | Pearson | July 17, 1951 |
| 2,597,028 | Pfann | May 20, 1952 |
| 2,671,735 | Grisdale | Mar. 9, 1954 |
| 2,692,839 | Christensen | Oct. 26, 1954 |
| 2,701,216 | Seiler | Feb. 1, 1955 |
| 2,763,581 | Freedman | Sept. 18, 1956 |